(12) United States Patent
Parkyn, Jr. et al.

(10) Patent No.: US 6,560,038 B1
(45) Date of Patent: May 6, 2003

(54) LIGHT EXTRACTION FROM LEDS WITH LIGHT PIPES

(75) Inventors: William A. Parkyn, Jr., Lomita, CA (US); David G. Pelka, Los Angeles, CA (US)

(73) Assignee: Teledyne Lighting and Display Products, Inc., Hawthorne, CA (US)

( * ) Notice: Subject to any disclaimer, the term of this patent is extended or adjusted under 35 U.S.C. 154(b) by 0 days.

(21) Appl. No.: 10/007,949

(22) Filed: Dec. 10, 2001

(51) Int. Cl.[7] .................. G02B 17/00; G02B 13/18; G02B 27/30; H01J 63/04; F21V 3/00
(52) U.S. Cl. .................. 359/726; 359/708; 359/712; 359/719; 359/641; 313/512; 313/111; 313/113; 362/307; 362/310; 362/311; 362/293; 385/12; 385/34; 385/901; 250/227.11; 250/573; 340/630
(58) Field of Search .................. 359/726, 708, 359/711, 712, 718, 719, 727, 641; 362/310, 311, 307, 255, 293, 304, 327, 555, 559; 313/512, 111, 113, 499; 385/33, 34, 12, 94, 93, 901; 250/227.11, 573; 340/630, 628

(56) References Cited

U.S. PATENT DOCUMENTS

| | | | | |
|---|---|---|---|---|
| 4,342,908 A | * | 8/1982 | Henningsen et al. ... | 250/227.11 |
| 5,343,330 A | * | 8/1994 | Hoffman et al. ............ | 359/708 |
| 5,485,317 A | * | 1/1996 | Perissinotto et al. ........ | 359/712 |
| 5,526,190 A | * | 6/1996 | Hubble, III et al. ........ | 359/719 |
| 5,581,241 A | * | 12/1996 | Kaufman et al. ........... | 340/630 |
| 5,699,201 A | * | 12/1997 | Lee ............................. | 359/708 |
| 5,757,557 A | * | 5/1998 | Medvedev et al. ......... | 359/708 |
| 5,894,195 A | * | 4/1999 | McDermott .................. | 313/512 |
| 6,155,699 A | * | 12/2000 | Miller et al. ................. | 362/293 |
| 6,166,860 A | | 12/2000 | Medvedev et al. | |
| 6,181,476 B1 | | 1/2001 | Medvedev et al. | |
| 6,304,693 B1 | * | 10/2001 | Buelow, II et al. ........... | 385/34 |
| 6,328,456 B1 | * | 12/2001 | Mize .......................... | 362/311 |
| 6,361,190 B1 | * | 3/2002 | McDermott .................. | 362/310 |
| 6,370,288 B1 | * | 4/2002 | Itoh et al. ..................... | 385/12 |

\* cited by examiner

*Primary Examiner*—Loha Ben
(74) *Attorney, Agent, or Firm*—Kirkpatrick & Lockhart LLP

(57) ABSTRACT

A non-imaging optical coupler that is a figure of revolution combining a light-transmitting body defining a recessed input cavity, a transparent droplet-shaped encapsulant of a light-emitting diode, or array of diodes in the cavity, the body having a curved side wall shaped to totally internally reflect all the light emitted from the LED and encapsulant, traveling toward the side wall, within a predetermined distance from the diode or center of array, the body having a cylindrical transition section extending from a curved side wall and forwardly, and a planar exit face at the forward end of the body, transverse to the central axis of the figure of revolution.

13 Claims, 6 Drawing Sheets

LIGHT EXTRACTION FROM LEDS WITH LIGHT PIPES

BACKGROUND OF THE INVENTION

This invention relates generally to light extraction from LEDs, as for example to be directed into light pipes; and more specifically concerns provision of a non-imaging optical element that receives light from an LED, or array of LEDs, and efficiently redirects the light into a light pipe, without allowing any air gaps between the LED or LEDs and the light pipe entrance.

Recently, light-emitting diodes (LEDs) have become commercially important illumination sources for high-luminance applications. LEDs are miniature semiconductor light sources installed as a thin, active layer within a block of partially transparent material with high index of refraction. For example, Aluminum Indium Gallium Phosphide has optical index 3.6, while Indium Gallium Nitride has index 2.4. The high index has two deleterious effects that act to trap light within the absorbing semiconductor, especially when the die block is in air. First, total internal reflection (TIR) reduces the active layer's nearly-Lambertian emission out the top of the die by about $1/n^2$, where n is the optical index value. Second, this fraction of directly emitted light is further subject to Fresnel reflectance, which varies from $[(n-1)/(n+1)]^2$ at normal incidence, or 25% at n=3, to unity at the TIR angle. Thus, about 90% of the emitted light suffers at least one reflection, and must propagate through the lossy semiconductor medium to another die boundary, and most likely suffer yet another reflection.

LEDs typically employ a transparent encapsulant, often of epoxy, with refractive index about 1.5. This increases the emission fraction to one fourth, and reduces Fresnel reflectance to one ninth (ironically, swapping their values). The two most commercially significant encapsulant geometries are the bullet shaped lens and the globbed die-on-board (i.e. encapsulant covering the die mounted on a circuit board). In both cases, however, light that does escape the die must undergo further light trapping of about 50%, offsetting the full improvement possible. The losses of the bullet lens are inherent in its convenient shape, presently manufactured by the billions.

SUMMARY OF THE INVENTION

It is a major object of the invention to provide a solution and/or solutions to the above problems and difficulties. Basically, a non-imaging coupler is provided, as in the form of a figure of resolution (about the optical axis), and comprises a) a light transmitting body defining a recessed input cavity, a transparent-droplet encapsulant for a light emitting diode, or for an array of diodes in the cavity, b) there being a body curved side wall shaped to totally internally reflect all the light emitted from the LED and encapsulant within a predetermined distance from the diode or center of said array, c) there being a body cylindrical transition section extending from said curved side wall, and forwardly, and d) a planar exit face at the forward end of the body, transverse to an axis of said figure of revolution.

It is another object to provide, in association with the coupler, an endwise transparent rod that is juxtaposed to said body exit face, in order to receive light from the coupler. A bend is typically provided at the distal end of the rod when delivering light to a dental-curing site in a patient's mouth.

DETAILED DESCRIPTION

The term 'die on board' as used herein refers to the installation of an LED chip onto a general planar substrate, e.g. a printed circuit board. An encapsulant is typically used, typically consisting of a droplet (glob) of liquid synthetic resin placed over the die, typically hardened thereafter by the application of ultraviolet light.

Figure 1:
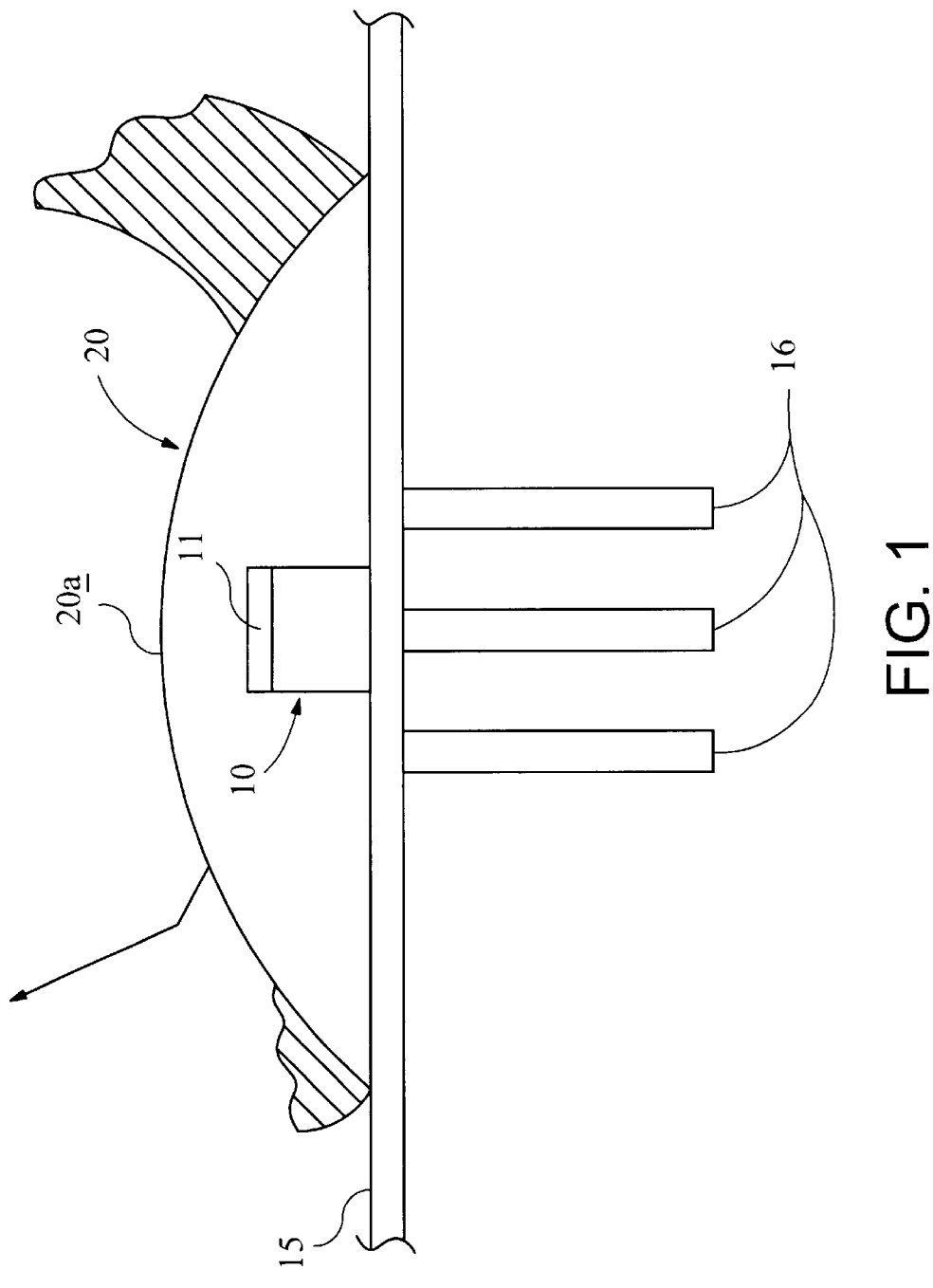
FIGS. 1–5 show various coupler combinations, in axial planar cross-sections.
Figure 2:
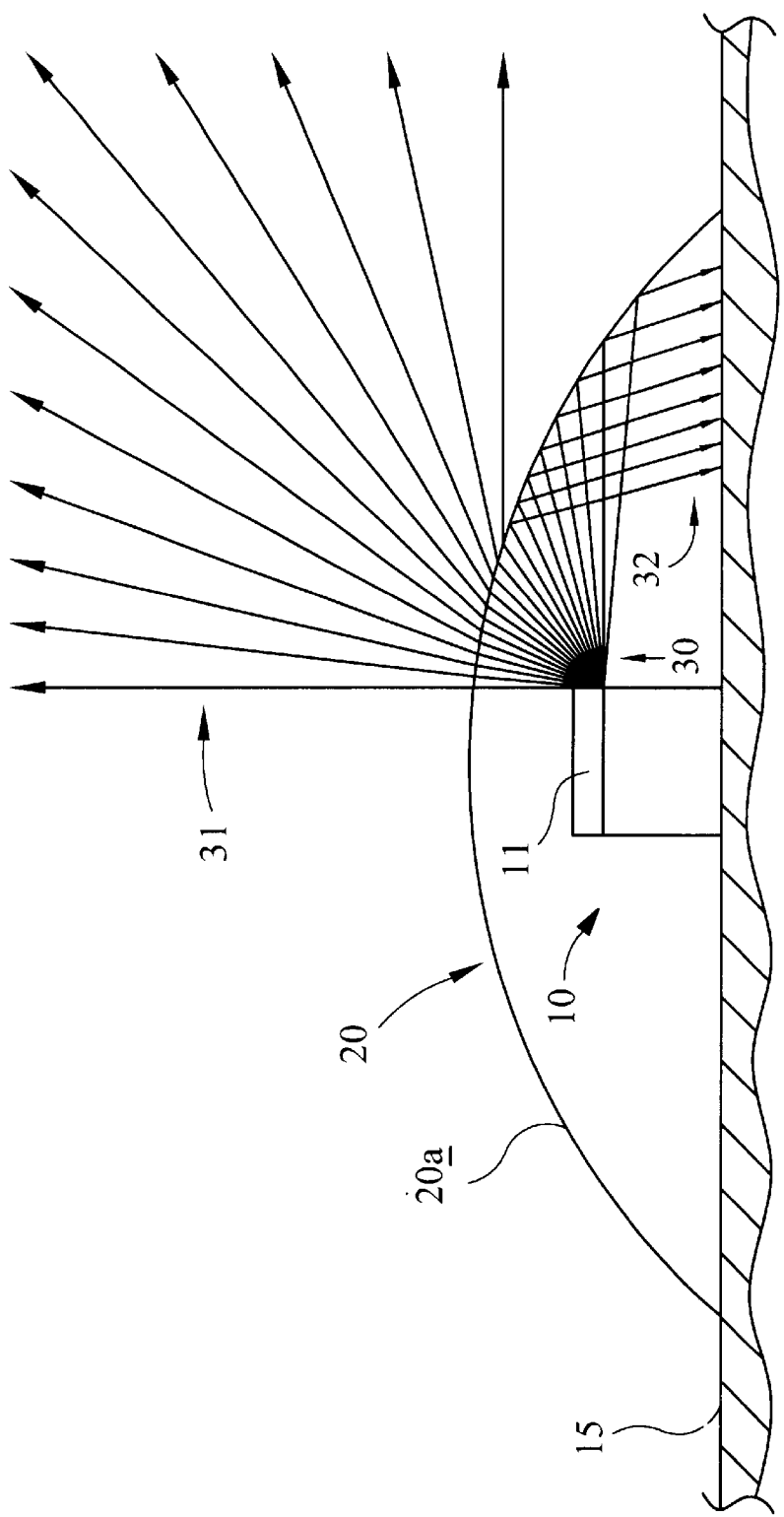

FIG. 1 shows light emitting diode 10, with emitting layer 11. The LED is mounted on circuit board 15, inside light transmitting epoxy glob 20, shaped predominantly by surface tension. Metal fins 16 attached to board 15 serve to convey the LED's heat to the outside air. The optically ideal glob shape is typically a full hemisphere, but this is difficult to accomplish in a production environment, so its potential for improvement is reduced. Instead, the surface tension of the liquid tends to flatten the droplet surface 20a relative to a hemisphere surface. As shown in FIG. 2, this gives rise to internal reflection of side-going light. See reflected rays 32. Active diode layer 11 emits an exemplary fan 30 of rays. Some are transmitted through the surface 20a of glob 20 and become rays 31. Others are totally internally reflected, becoming rays 32, which strike the top of circuit board 15 on which the LED is typically mounted to be absorbed or scattered. The present invention seeks to prevent these losses by ensuring efficient extraction of the diode's light emission, as for example all or substantially all such emissions.

State-of-the art high-power LEDs require highly effective means of heat removal, so they are typically installed directly on a heat exchanger. The present invention seeks to couple the light from such a high-power LED into a light pipe, specifically blue light ($\lambda \sim 465$ nm) for transmitting such light, as for example is used in curing of dental materials in situ. Longer wavelengths, such as red, however, are of interest in light pipes for dental whitening and for photodynamic therapy, and shorter wavelengths such as ultraviolet (UV) can be used for curing UV epoxies or exciting fluorescence via quantum dots and/or organic fluorescent materials.

The present invention enables coupling of light from a diode, or an array of high-power, globbed LEDs, into a cylindrical light pipe or fiber optic waveguide, through which the light propagates to be emitted at its distal end. Unlike most LEDs, which use ultraviolet-hardened epoxy for globs, ultraviolet-light-emitting LEDs require a different type of glob material. The present invention is suitable for ultraviolet-emitting LEDs as well, as long as such LEDs and associated structures are constructed from an ultraviolet-transparent material.

The invention contemplates provision of a non-imaging optical element that receives the light from an LED or array of LEDs and redirects it into a light pipe, excluding air gaps between the LED die and the light pipe. Furthermore, the non-imaging element operates solely by total internal reflection and thus needs no mirror-coating.

Figure 3:
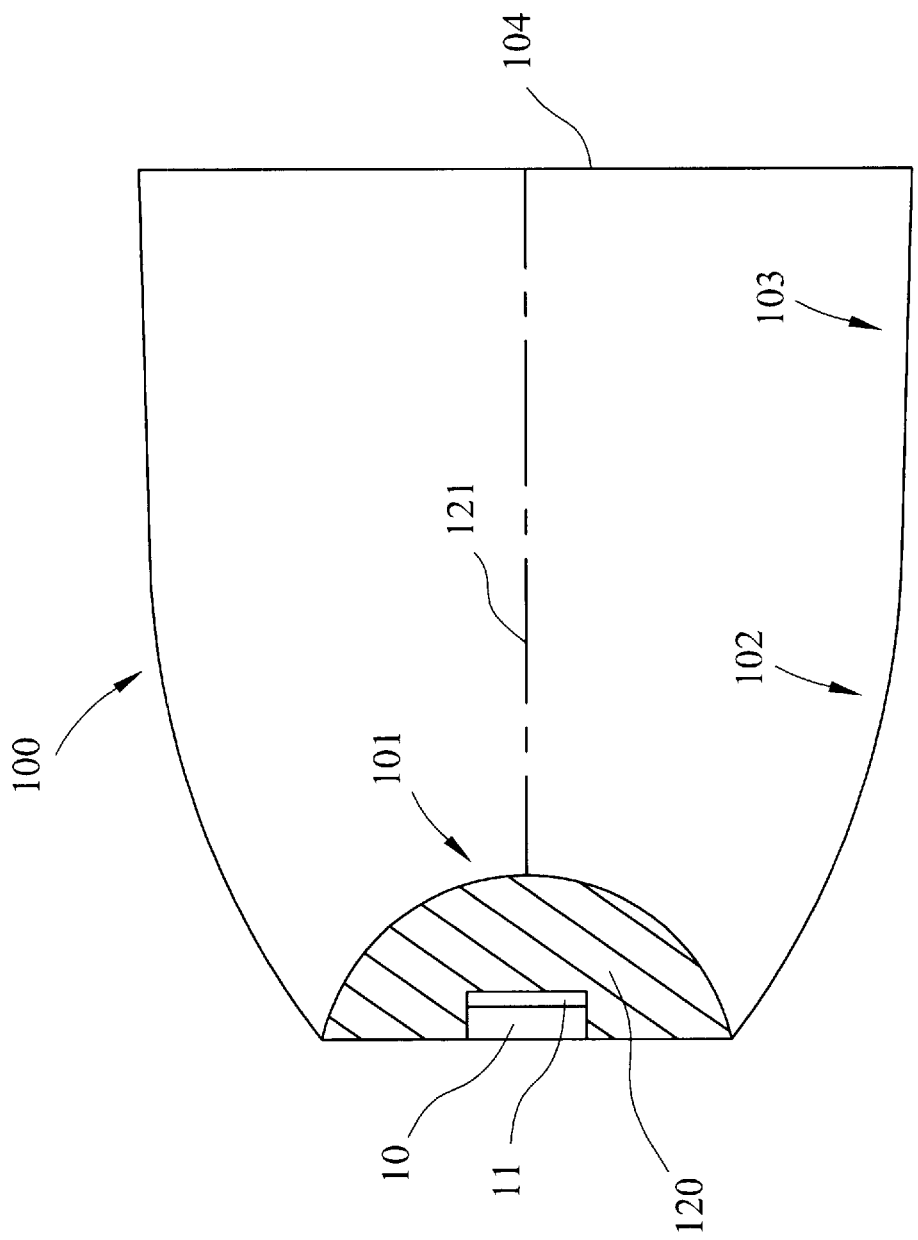

FIG. 3 shows a cross-section of non-imaging coupler 100, with recessed cavity or indentation 101 to receive an LED encapsulant glob 120, curved side wall 102, cylindrical section 103, and exit face 104. The optical axis appears at 121, walls 102 and 103 being figures of revolution about 121. Typically, the device 100 is manufactured by injection molding, with acrylic being the most common candidate light-transmitting plastic material.

Figure 4:
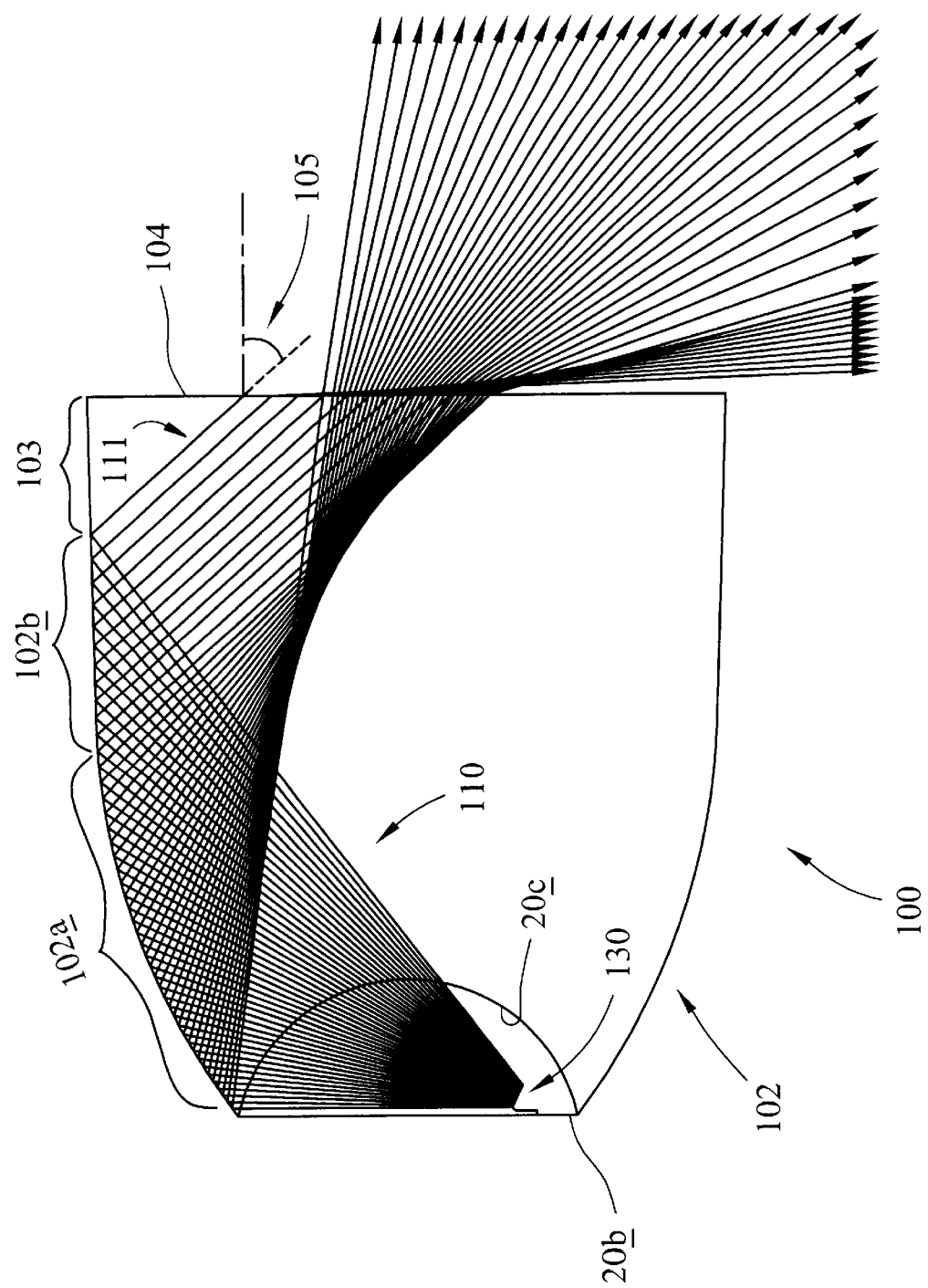

FIG. 4 shows non-imaging coupler body 100 with ray fan 110, emitted from the focal point 130, which is used to determine or calculate the shape of curved side wall 102, which consists of two sections. Section 102a is shaped by choosing a local slope that totally internally reflects incident rays 110. Surface of 102a has increasing curvature toward rim 20b of cavity 20c. Section 102b is a portion of a parabola with focus at the origin of ray fan 110, and oriented and sized to smoothly join with both spiral section 102a and cylindrical section 103. This parabolic section 102b reflects rays 110 into parallel rays shown at 111 and having incidence angle 105 with body exit face 104. For acrylic material, the angle is selected as $\theta_M=41.5°$, quite near the optically critical reflectance angle of $\theta_c=\sin^{-1}(1/1.5)=41.81°$.

Figure 5:
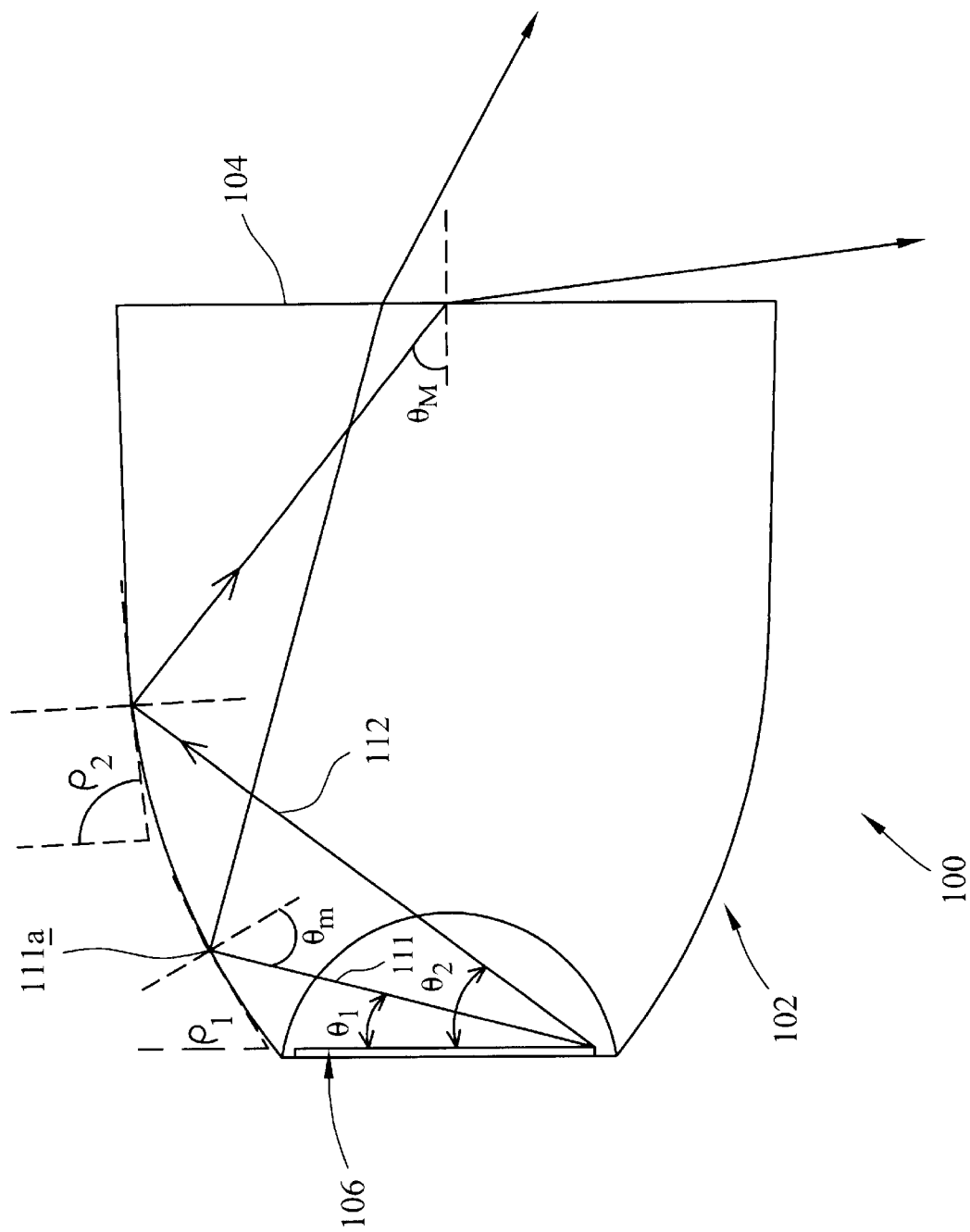

FIG. 5 shows non-imaging coupler 100 with two exemplary rays 111 and 112, emitted from the radially outermost part of LED array 106. Ray 111 makes angle $\theta_1$ with the plane of array 106, and strikes side wall 102 at a point 111a having slope angle $\rho_1$, which is determined so that the incidence angle equals $\theta_m$, slightly more than $\theta_c$, according to $$\rho_1=\theta_1-\theta_m+90°. \quad (1)$$

In FIG. 5, ray 112 makes angle $\theta_2$ with the plane of the array and strikes side wall 102 at a point having slope angle $\rho_2$, which is determined by having to reflect ray 112 onto exit face 104 at an incidence angle equal to $\theta_M$, such that $$\rho_2=(90°-\theta_2-\theta_M)/2. \quad (2)$$

Figure 6:
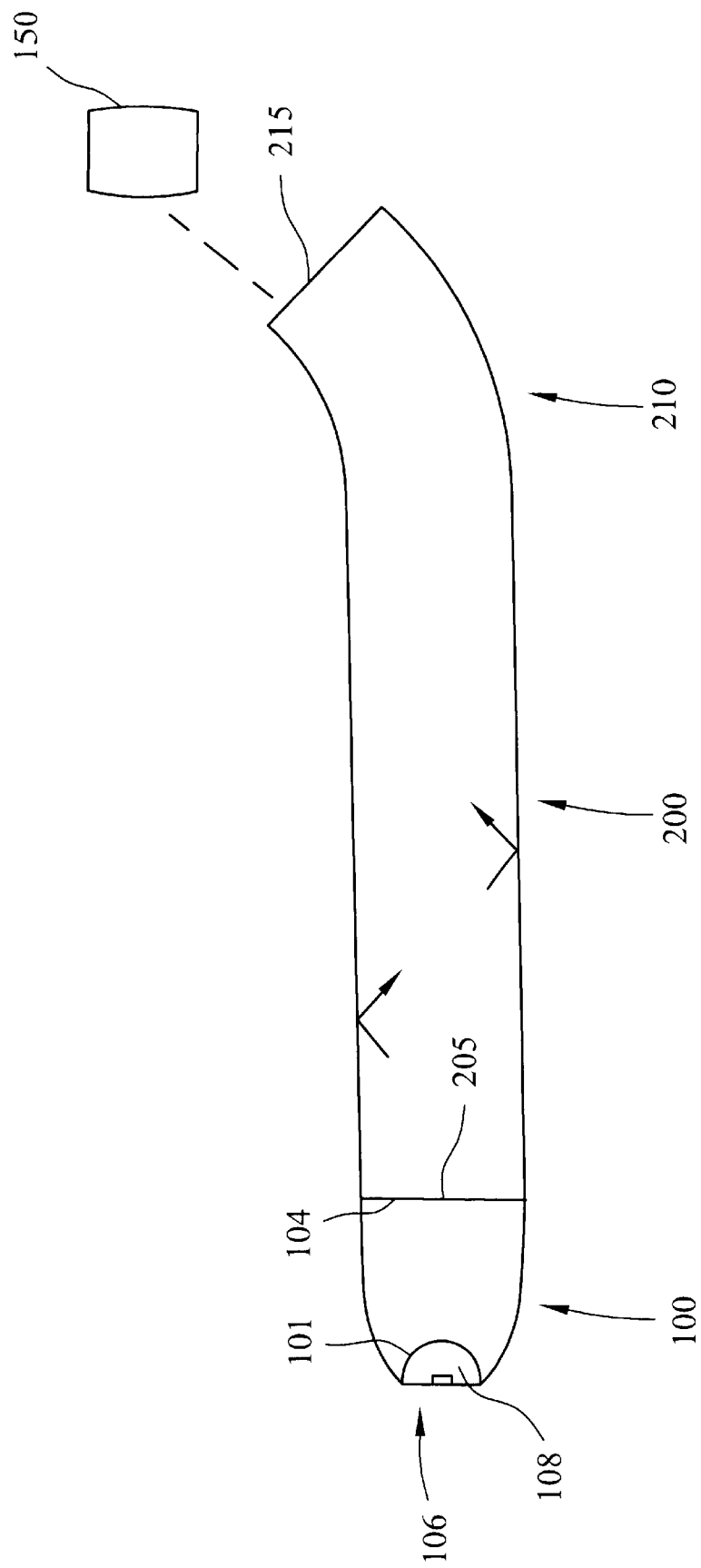
FIG. 6 shows an endwise transparent rod to associate with the coupler and transmit light, for example to be used in dental whitening.

FIG. 6 shows coupler 100 with LED array 106, with index-matching fluid 108 in cavity formed by indentation 101. Transparent rod 200, which may also be formed from a group of closely compacted plastic or glass fibers, is placed so that entry face 205 is juxtaposed to exit face 104, receiving its light output thereby. Typically the two end faces are in flat surface-to-surface engagement to exclude air gaps. Bend 210 is situated near rod end 215, for convenience of application. Use for dental material curing, or dental whitening, is indicated schematically at 150, where 150 represents dental material being cured, or teeth being whitened.

We claim:

1. A non-imaging optical coupler that is a figure of revolution comprising, in combination:
    a) a light-transmitting body defining a recessed input cavity, a transparent-droplet shaped encapsulant of a light emitting diode, or array of diodes in the cavity,
    b) there being a body curved side wall shaped to totally internally reflect all the light emitted from the LED and encapsulant, traveling toward said side wall, within a predetermined distance from the diode or center of said array,
    c) there also being a body cylindrical transition section extending from said curved side wall and forwardly,
    d) a planar exit face at the forward end of the body, transverse to an axis of said figure of revolution.

2. The combination of claim 1 in association with an endwise transparent rod that is juxtaposed to said body exit face in order to receive light from said coupler.

3. The combination of claim 2 with a bend at the distal end of said rod, for use in delivering said light to a dental-curing site in a patient's mouth or for delivery internally or externally for photodynamic therapy applications for epoxy curing or fluorescence excitement.

4. The combination of claim 2 wherein said body exit face flatly engages the rod end face that receives light transmission from the body.

5. The combination of claim 1 wherein said diode or array of diodes comprise a source of one of the following:
    i) blue light, used for curing of dental materials, photodynamic therapy
    ii) red light used for dental whitening, photodynamic therapy
    iii) UV light for UV curing epoxies or for stimulation of fluorescent emission.

6. The combination of claim 1 wherein the body has two external wall sections, one of which is parabolic, and the other of which joins said one section, and has increasing curvature toward the rim of said cavity.

7. The combination of claim 6 wherein said one section is configured to reflect light rays from the cavity toward the body exit face and to have angles $\theta_m$ of incidence with said body exit face, where $\theta_m$ is slightly less than $\sin^{-1}(1/n)$ for refractive index n of said light-transmitting body.

8. The combination of claim 1 wherein the encapsulant in the cavity excludes any air gap between the encapsulant and the cavity interior wall.

9. The combination of claim 1 wherein the encapsulant consists of epoxy or silicone.

10. The method of efficiently transmitting light from an LED, or array of LEDs, that includes:
    a) providing a light transmitting body defining a recessed input cavity, a transparent-droplet shaped encapsulant of a light emitting diode, or array of diodes in the cavity,
    b) the body provided to have a curved side wall shaped to totally internally reflect substantially all the light emitted from the LED and encapsulant, traveling toward said side wall, within a predetermined distance from the diode or center of said array,
    c) the body provided to have a cylindrical transition section extending from said curved side wall and forwardly,
    d) and the body provided to have a planar exit face at the forward end of the body, transverse to an axis of said figure of revolution.

11. The method of claim 10 including providing an endwise transparent rod that is juxtaposed to said body exit face in order to receive light from said coupler.

12. The method of claim 11 including providing said body to have a bend along its length, for use in delivering said light to a dental-curing site in a patient's mouth.

13. The method of claim 11 including employing said rod to deliver light to a dental-curing site, photodynamic therapy site, epoxy curing site or fluorescent excitation site.

* * * * *

UNITED STATES PATENT AND TRADEMARK OFFICE
CERTIFICATE OF CORRECTION

PATENT NO. : 6,560,038 B1
DATED : May 6, 2003
INVENTOR(S) : Parkyn, Jr. et al.

It is certified that error appears in the above-identified patent and that said Letters Patent is hereby corrected as shown below:

Column 4,
Lines 27 and 28, delete "$\Theta m$" and insert -- $\Theta_M$ -- therefor.

Signed and Sealed this

Third Day of May, 2005

JON W. DUDAS
*Director of the United States Patent and Trademark Office*